Figure 1A:
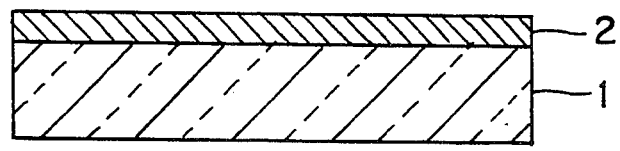
Figure 1B:
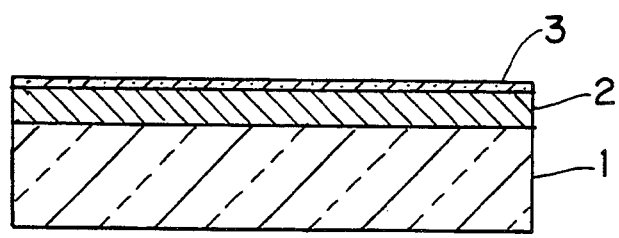

United States Patent [19]
Armini et al.

[11] Patent Number: 5,379,712
[45] Date of Patent: Jan. 10, 1995

[54] METHOD OF EPITAXIALLY GROWING THIN FILMS USING ION IMPLANTATION

[75] Inventors: Anthony J. Armini, Manchester; Stephen N. Bunker, Wakefield, both of Mass.

[73] Assignee: Implant Sciences Corporation, Wakefield, Mass.

[21] Appl. No.: 51,990

[22] Filed: Apr. 26, 1993

Related U.S. Application Data

[63] Continuation-in-part of Ser. No. 747,736, Aug. 20, 1991, abandoned.

[51] Int. Cl.$^6$ ............................................. C30B 9/00
[52] U.S. Cl. ........................................ 117/75; 117/79; 117/929; 117/931; 117/936
[58] Field of Search ............... 156/600, 605, 606, 624; 427/20, 22, 28

[56] References Cited

U.S. PATENT DOCUMENTS

| | | | |
|---|---|---|---|
| 3,765,956 | 10/1973 | Li | 437/20 |
| 4,816,421 | 3/1989 | Dynes et al. | 437/20 |
| 4,997,636 | 3/1991 | Prins | 403/446 |

FOREIGN PATENT DOCUMENTS 118127  1/1968  United Kingdom .

*Primary Examiner*—Robert Kunemund
*Attorney, Agent, or Firm*—Joseph S. Iandiorio; Kirk Teska

[57] ABSTRACT

A method of epitaxially growing a surface layer on a substrate including the steps of coating the substrate surface, with a meltable film, melting the film and implanting ions into he melted film, to deposit ion material onto the coated substrate surface.

19 Claims, 2 Drawing Sheets

METHOD OF EPITAXIALLY GROWING THIN FILMS USING ION IMPLANTATION

RELATED APPLICATION

This application is a continuation in part of application No. 747,736, filed Aug. 20, 1991, now abandoned.

FIELD OF INVENTION

This invention relates to a method of epitaxially growing thin films on a substrate by ion implantation into a liquid substance on the surface of the substrate.

BACKGROUND OF INVENTION

There exist a number of methods for growing epitaxial films on substrates. Chemical vapor deposition and molecular beam epitaxy are commonly used for growing single crystal silicon and other group III-V compound semiconductor films on single crystal substrates. The chemical vapor deposition processes typically take place at a relatively high temperature of 700 to 1000 degrees centigrade, partially to provide a small amount of mobility to the material being deposited in an attempt to grow single crystal films on a single crystal lattice. Such high temperature processes, however, may introduce strain to the epitaxial film on cooling due to mismatch in thermal expansion between the substrate and the film. Also, such chemical vapor deposition methods typically utilize expensive and extremely toxic feed gases to effect the process.

There is currently much effort being made to deposit single crystal diamond on non-diamond substrates. For example, it would be desirable to grow diamond on silicon so that existing microcircuit technology can be used to form circuits in the diamond film. However, single crystal diamond has successfully been grown only on natural diamond substrates using chemical vapor deposition. It has recently been reported that a group from North Carolina State University has fabricated continuous diamond films on single crystal copper substrates. The reported process involves implanting carbon into copper and heating the implanted surface with a high energy extremely short laser pulse to melt only the upper portion of the substrate including the implanted carbon. The carbon then solidifies as single crystal diamond. However, the single crystal copper substrate material is extremely expensive. In addition, the size of the film is inherently limited by the small area of the laser beam used to melt the copper (up to 1 cm2). Further, the method reportedly results in a diamond film of only 500 Angstroms thickness, which would be useful only as a seed for growing thicker films through conventional chemical vapor deposition techniques.

SUMMARY OF INVENTION

It is therefore an object of this invention to provide a method of growing thin films of single crystal substances.

It is a further object of this invention to provide such a method which may use an inexpensive substrate material.

It is a further object of this invention to provide such a method which is performed at such low temperatures that no thermal strain is produced in the film.

It is a further object of this invention to provide such a method which can be used to grow films of arbitrary thickness.

It is a further object of this invention to provide such a method which may be used to grow large area films.

It is a further object of this invention to provide such a method which can be used to grow single crystal diamond films on non-diamond substrates.

It is a further object of this invention to provide such a method which does not use toxic materials.

It is a further object of this invention to provide such a method which can operate at a low temperature.

This invention results from the realization that single crystal films such as single crystal diamond can be grown on single crystal substrates by implanting the material to be deposited in a liquid layer provided on top of the substrate.

This invention consists essentially of a method of epitaxially growing a single crystal or polycrystalline surface layer on a substrate including the steps of coating a substrate surface with a meltable film, melting the film, and implanting ions into the melted film to deposit ion material onto the coated substrate surface. The method may further include depositing a capping layer on the meltable film before melting to help retain the melted film on the substrate surface.

The substrate surface may be coated with a meltable film and/or the capping layer by evaporation or other deposition method. Preferably, the meltable film has a melting point of less than the substrate to keep the substrate solid when the film is melted. The film material preferably has a low evaporation rate at the operating temperature so it remains on the substrate. The film may be melted by heating the surface-coated substrate, for example in a tube furnace. Preferably, the ions are implanted toward the center of the film to allow the ions to settle onto the coated substrate surface without disrupting the substrate lattice.

The method may further include the step of cooling the implanted melted film and then removing at least a portion of the cooled implanted film to expose the deposited material. At least a portion of the substrate may also be removed after implantation to expose the other side of the deposited material.

The substrate is diamond, silicon, sapphire, titanium carbide or germanium. Preferably, the substrate is a single crystal. The implanted ions include carbon silicon and germanlure. The meltable film materials are metals including aluminum, gallium, indium, tin, copper, gold and silver.

For growing single crystal diamond on single crystal silicon, the implanted ions are carbon ions implanted with a high-energy ion beam at from 10 keV to 200 keV.

DISCLOSURE OF PREFERRED EMBODIMENT

Figure 2:
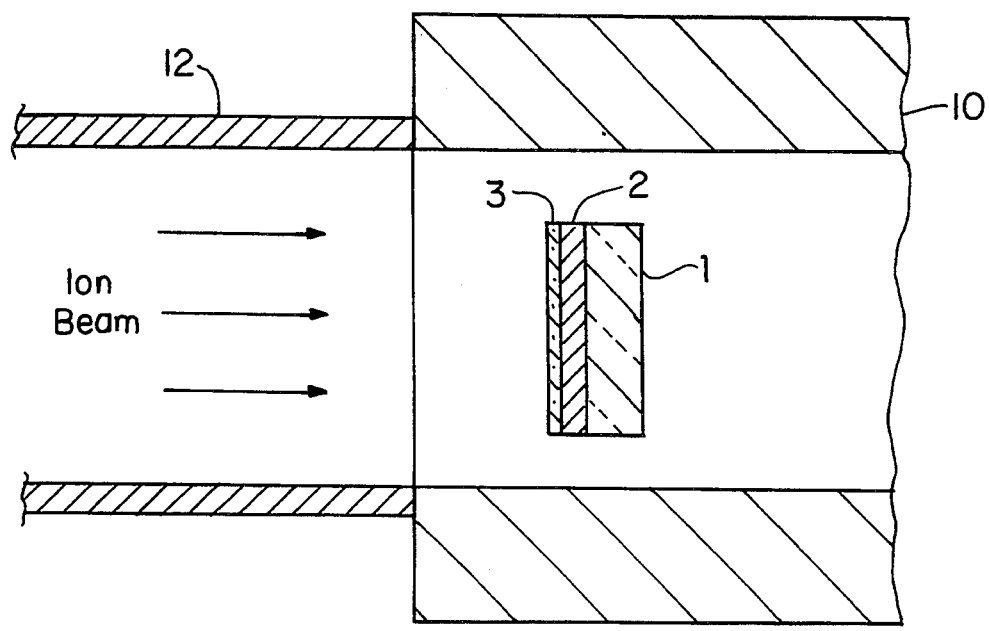
Figure 3:
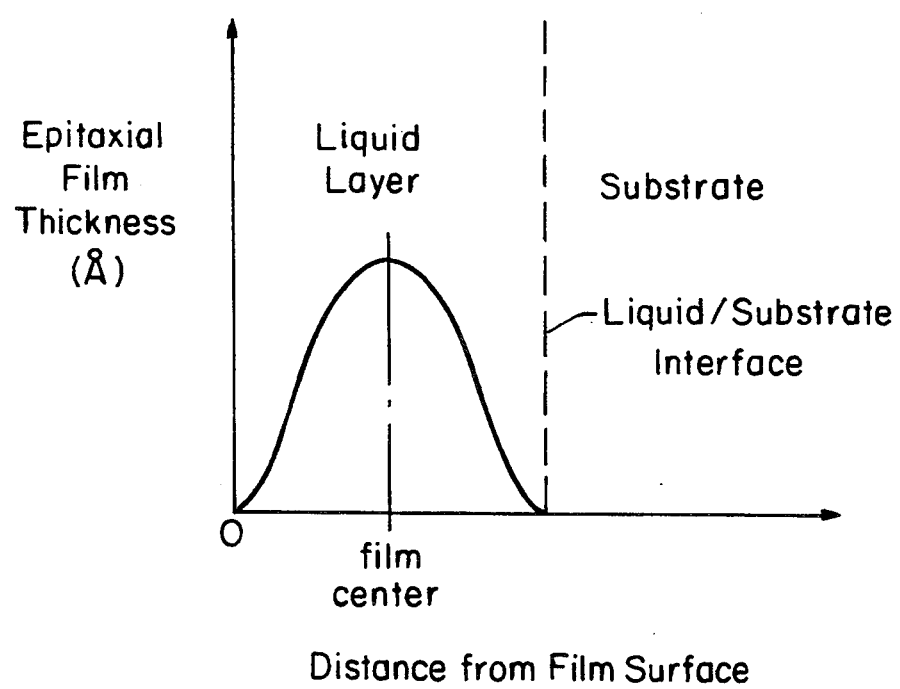

Other objects, features and advantages will occur to those skilled in the art from the following description of a preferred embodiment and the accompanying drawings, in which:

FIGS. 1A through 1D schematically illustrate a method according to this invention;

FIG. 2 is a schematic diagram of an apparatus for practicing the method of this invention; and FIG. 3 is an illustration of a preferred distribution of the implanted ions in the liquid film to accomplish single crystal deposition.

This invention may be accomplished in a method of epitaxially growing a surface layer on a substrate by coating a surface of the substrate with a film of meltable material, melting the film, and implanting ions into the melted film to deposit the ion material onto the coated substrate surface. Preferably, the substrate is a single crystal material with a cubic crystal structure and lattice constant close to that of the film to be grown to insure growth of a single crystal film.

FIGS. 1A through 1D illustrate schematically an embodiment of a method according to this invention. The first step is to choose a substrate 1 having the desired properties. For growing single crystal films, especially single crystal diamond. it is important to select a single crystal substrate having a crystal structure and lattice constant close to that of the crystal to be grown on the surface of the substrate. Single crystal silicon is a suitable substrate material for deposition of single crystal diamond films. Other candidate single crystal solids include sapphire, titanium carbide, and germanium. One surface of the substrate is prepared as a deposition site by cleaning to remove any contaminants through sputter etching in vacuum. Preferably, between 50 and 100 Angstroms of material are removed to expose a clean surface which acts as the seed site. For a polycrystalline film, it is not necessary to begin with a single crystal substrate, or one with a crystal structure and lattice constant close to that of the deposited material.

The next step in the process is to deposit a layer of meltable material 2 on the cleaned surface of substrate 1. Layer 2 of meltable material provides an atmosphere for rapid diffusion of the implanted ions, as described below. The material of layer 2 preferably has a melting point less than that of the substrate so that the substrate remains solid. Layer 2 is made of a material that does not react with the implanted ions or the substrate including aluminum, gallium, indium, tin, copper, silver and gold. Layer 2 is preferably approximately 5,000 to 30,000 Angstroms thick and deposited on the substrate by evaporation or sputter deposition.

To uniformly deposit material across the entire surface of the substrate, it is important that, when melted, the meltable film material wet the entire substrate starface and have relatively uniform thickness. For substances and substrates which will not together possess these properties, an additional step illustrated in FIG. 1B may be used. This step includes the deposition on top of meltable layer 2 of a capping layer of perhaps 1,000 to 2,000 Angstroms thickness of a material having a higher melting point than the material of layer 2. Such a capping layer would then act to physically constrain the material of layer 2 when it was melted to maintain its thickness and wetting on the surface of substrate 1. Such a material is silicon.

Figure 1C:
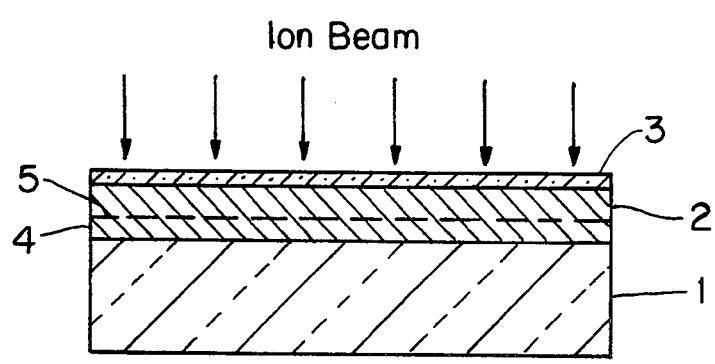

Next, the coating layer 2 is melted by heating the substrate above the coating's melting point. As illustrated in FIG. 1C, the desired ions are then implanted into liquid layer 2 by ion implantation, preferably at 50 keV to 200 keV. The ion dose is selected achieve a desired deposited film thickness.

The layer of liquid into which ions are implanted provides an atmosphere rapid diffusion of the ions. The implanted ions settle down onto the surface of substrate 1. The Brownjan motion phenomenon provides the ion material movement which allows the material to settle onto the surface of the seed lattice in its lowest energy state, thereby providing an environment which allows the growth of single crystal films on single crystal substrates. For example, carbon atoms may be implanted into non-reactive metals to deposit a single crystal diamond film on a single crystal substrate having a suitable crystal structure and lattice constant, for example diamond and silicon.

The ion implantation may be carried out for a desired time to achieve a desired film thickness. Because of the implantation energy, liquid layer 2 will slowly deplete by sputtering away. Accordingly, to grow extremely thick films, it may be necessary to replenish the liquid layer, for example by evaporation.

Figure 1D:
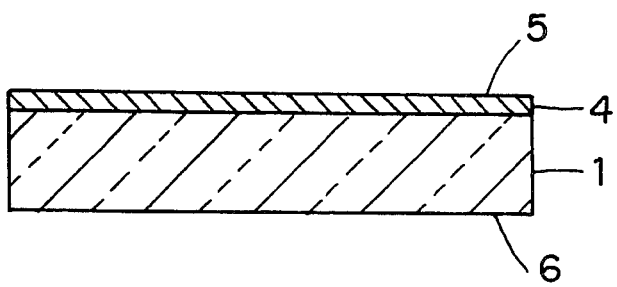

Once the implantation step is complete, the substrate is cooled to solidify the melted layer. The capping layer, if present, and the remaining layer of meltable material may then be removed, for example by etching, to expose surface 5 of epitaxial film 4. FIG. 1D. Additionally, some or all of substrate 1 may be removed starting from back surface 6 to expose some or all of the other side of film 4 as well, depending on the intended use of the epitaxial layer (for example to create a window).

FIG. 2 illustrates schematically apparatus 14 which may be used to practice the method of this invention. Preferably, substrate I with meltable coating 2 and capping layer 3, if necessary, is heated in tube furnace 10 placed at the outlet end of ion beam implanter 12 to implant the ions at the desired energy and close into liquid 2. A preferable ion distribution is illustrated in FIG. 3, which illustrates a theoretical distribution of implanted ion material in the melted film. This figure illustrates not the actual film thickness but the theoretical film thickness in the liquid layer as if the deposited film remained in the liquid. Preferably, the ions are implanted at an energy which results in implantation taking place primarily in the center of the film so that the implanted ions deposit on the film/substrate interface by settling through some of the film thickness without entering the substrate at high energy and thereby disrupting the lattice.

EXAMPLE I

The following process conditions are capable of growing single crystal diamond:

| | |
|---|---|
| Substrate: | Single crystal silicon <111> face |
| Meltable film: | Indium metal, 1 micron thick |
| Capping layer: | $SiO_2$, 1500 Å thick |
| Ion beam: | $Carbon^{12}$ |
| Ion beam energy: | 200keV |
| Ion beam current: | 300 μA |
| Beam area: | 4 $cm^2$ |
| Substrate temp: | 600° C. |
| Total dose: | $5 \times 10^{18} C^+/cm^2$ |

Upon cooling of the water, the remaining Indium film should be dissolved away using concentrated hydrochloric acid. The crystalline diamond film remaining on the silicon substrate will be approximately 2000 Angstroms thick other combinations of meltable films and ion beam substances for diamond, silicon, and germanium substrates include:

| SUBSTRATE | MELTABLE FILMS | ION BEAM | RESULTANT FILM GROWN |
|---|---|---|---|
| Diamond | Gallium Indium Tin Copper Gold Silver | Carbon | Carbon (Diamond form) |
| Silicon | Gallium | Carbon | Carbon (Diamond) |

| SUBSTRATE | MELTABLE FILMS | ION BEAM | RESULTANT FILM GROWN |
|---|---|---|---|
| | Indium Tin | Silicon | Silicon |
| | Copper Gold Silver | Germanium | Germanium |
| Germanium | Gallium | Silicon | Silicon |
| | Indium Tin | Germanium | Germanium |

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A method of growing a surface layer of a substance on a substrate, comprising:
   coating the substrate surface with a meltable film which has a melting point less than that of a substrate;
   melting said film, and
   implanting ions of the substance into the melted film to facilitate growth of a surface layer of the substance on the substrate.

2. The method of claim 1 further including depositing a capping layer on said meltable film before melting to retain the melted film on the substrate surface.

3. The method of claim 1 in which coating a substrate surface is accomplished by sputter deposition.

4. The method of claim 1 in which coating a substrate surface is accomplished by evaporation.

5. The method of claim 1 in which the meltable film has a melting point of less than the substrate to keep the substrate solid when the film is melted.

6. The method of claim 1 in which the film is melted by heating the surface-coated substrate.

7. The method of claim 1 in which the ions are implanted toward the center of the film to allow the ions to settle onto the coated substrate surface.

8. The method of claim 1 further including the step of cooling the implanted melted film.

9. The method of claim 8 further including the step of removing at least a portion of the cooled implanted film to expose the deposited material.

10. The method of claim 1 further including the step of removing at least a portion of the substrate after ion implantation to expose the deposited material.

11. The method of claim 1 in which the substrate is a single crystal substance.

12. The method of claim 11 in which the substrate material is selected from the group of substances consisting of diamond, silicon, sapphire, titanium carbide and germanium.

13. The method of claim 1 in which the implanted ions are selected from the group of substances consisting if carbon, silicon and germanium.

14. The method of claim 1 in which the meltable film material is a metal.

15. The method of claim 14 in which the meltable film material is selected from the group of substances consisting of aluminum, gallium, indium, tin, copper, silver and gold.

16. The method of claim 1 in which the ions are implanted at an ion beam energy of from 10 keV to 200 keV.

17. A method of epitaxially growing a single crystal surface layer on a single crystal substrate, comprising:
   providing a single crystal substrate selected from the group including silicon, sapphire, titanium carbide and germanium;
   coating a substrate surface with a meltable film of one or more of aluminum, gallium, indium, tin, copper, silver and gold;
   heating the coated substrate above the film melting point to melt the film;
   implanting ions of a substance selected from the group consisting of carbon, silicon and germanium into the melted film to deposit ion material onto the coated substrate surface in a single crystal structure;
   cooling the substrate to solidify the film; and
   removing the film to expose the single crystal deposited material.

18. A method of epitaxially growing a single crystal diamond surface layer on a single crystal silicon substrate, comprising:
   coating a substrate surface with a meltable film which does not substantially react with the substrate or carbon;
   heating the substrate to melt the film;
   implanting carbon ions into the melted film with a high-energy ion beam at between 10 keV and 200 keV to deposit carbon on the substrate surface as a single crystal diamond;
   cooling the substrate to harden the film; and
   removing the film to expose the single crystal diamond material.

19. A method of epitaxially growing a single crystal surface layer on a single crystal substrate, comprising:
   providing a single crystal silicon substrate;
   coating the silicon substrate surface with a meltable film of one or more of gallium, indium, tin, copper, silver and gold;
   heating the coated substrate above the film melting point to melt the film thereon;
   implanting ions of a substance selected from the group consisting of carbon, silicon and germanium into the melted film to deposit ion material onto the substrate surface in a single crystal structure;
   cooling the substrate to solidify the film; and
   removing the film to expose the single crystal deposited material.

* * * * *